(12) United States Patent
Shin

(10) Patent No.: US 6,476,694 B1
(45) Date of Patent: Nov. 5, 2002

(54) NON-RADIATIVE DIELECTRIC WAVEGUIDE CIRCUIT POSITIONED BETWEEN TWO METAL PLATES WHICH ARE MULTI-LAYERED FOR DIFFERENT SIZES OF SPACES

(75) Inventor: Cheon Woo Shin, 13-205, Sarnick-Apartment, 148, Namcheon-Dong, Suyong-Ku, 613-010 Pusan (KR)

(73) Assignees: Cheon Woo Shin, Pusan (KR); Sensing Tech Corp., Pusan (KR)

( * ) Notice: Subject to any disclaimer, the term of this patent is extended or adjusted under 35 U.S.C. 154(b) by 0 days.

(21) Appl. No.: 09/624,288

(22) Filed: Jul. 24, 2000

(51) Int. Cl.$^7$ .................................................. H01P 3/00
(52) U.S. Cl. ...................................... 333/239; 333/218
(58) Field of Search .................................. 333/128, 239, 333/218

(56) References Cited

U.S. PATENT DOCUMENTS 5,815,123 A * 9/1998 Uematsu et al. ............ 343/785
5,861,782 A * 1/1999 Saito ............................ 333/329
6,094,106 A * 7/2000 Kishino et al. ................ 333/22
6,163,227 A * 12/2000 Saitoh et al. ................ 333/117
6,262,641 B1 * 7/2001 Kato et al. ................... 333/218

* cited by examiner

Primary Examiner—Robert Pascal
Assistant Examiner—Joseph Chang
(74) Attorney, Agent, or Firm—The Maxham Firm

(57) ABSTRACT

A circuit with non-radiative dielectric waveguides held between two parallel metal plates which are multi-layered. Since the circuit has different heights of spacers between the plates owing to multiple layers, different sizes of non-radiative dielectric waveguides that are designed according to their using frequencies, are all inserted into a single circuit. By use of the present invention, we are capable of constructing a super-heterodyne receiver, which has the characteristic of mixing received waves through a local oscillator to produce an intermediate frequency. With the intermediate frequency, it is a lot easier to enhance amplitude and consequently reception sensitivity is improved.

6 Claims, 4 Drawing Sheets

Magnetic field

Frequency of oscillation $f_0$ $3f_0$ Power

NON-RADIATIVE DIELECTRIC WAVEGUIDE CIRCUIT POSITIONED BETWEEN TWO METAL PLATES WHICH ARE MULTI-LAYERED FOR DIFFERENT SIZES OF SPACES

BACKGROUND OF THE INVENTION

1. Field of the Invention

The present invention relates to a non-radiative dielectric waveguide circuit which can generate multiple frequencies, compared to a conventional non-radiative dielectric waveguide circuit which can generate only a single frequency.

2. Description of Related Art

In the age of multimedia, the content of information delivery has changed from text to text and graphics, and now it is changing to also include moving images. Moreover, the technique of utilizing moving images is now being improved to provide high resolution and delicate color. As a result, computer communication has undertaken the heavy burden of multimedia information delivery.

As one way to overcome this problem, computer communication is being upgraded from T1 level to T3 level. However, this upgrade has some shortcomings; for example, it is a costloy mode of communication because the cost of optical fiber construction is enormous. Furthermore, sometimes the construction itself gets to be difficult in places where a building has already been built. As a result, we are facing the need to develop an ultra-highspeed radio transmitter that corresponds to the demand for ultra-highspeed terminals for radio data communication.

In order to increase the speed of data transmission, we need to raise a using frequency. Raising the using frequency, however, causes a wavelength to become shorter. One important problem with this is propagation loss, We can generally think of the MMIC method as a way of dealing with more than the microwave frequency band. At the frequency of 50 GHz, however, this method shows the propagation loss of 60 db per 1 m.

To solve the problem of propagation loss, the method of utilizing a non-radiative dielectric waveguide has been introduced. The method is considered to be preferable with some advantages. Since the method has a non-radiative characteristic, its propagation loss is a lot smaller than that of a microstrip circuit. In addition, it's much easier to build a transmission line with a non-radiative dielectric waveguide than with a waveguide. In particular, the non-radiative dielectric waveguide possesses the capability of dealing with a millimeter wave band of more than 30 GHz.

The non-radiative dielectric waveguide prevents transmission waves from leaking out of the waveguide. This is achieved by inserting the non-radiative dielectric waveguide (2) between two parallel metal plates(1) as in FIG. 1. When transmission waves flow along the non-radiative dielectric waveguide, either LSM mode or LSE mode is generated as shown in FIG. 2. In order to minimize propagation loss and fabricate a circuit in a convenient way, we use LSM 01 mode, which is the lowest mode of LSM mode.

The size of a non-radiative dielectric waveguide is defined by the equations below:

$$\sqrt{\varepsilon_r - 1}\, b/\lambda \approx 0.4 \sim 0.6 \qquad \text{Eq. 2}$$

where $\varepsilon_r$ is the dielectric constant and $\lambda$ is the wavelength.

As an example of the above equations 1 and 2, suppose that a non-radiative dielectric waveguide has a dielectric constant of 2.04 and a wavelength of 5 mm at a frequency of 60 GHz. Then, solving for a and b, the waveguide has a height a of 2.25 mm and a width b of 2.5 mm. In other words, the space between the metal plates turns out to be 2.25 mm.

When a circuit is fabricated, it is necessary to place a spacer made of metal between the two metal plates as shown in FIG. 3. For the above experiment, the spacer should have a height of 2.25 mm. The spacer is supposed to be inserted into a non-radiative dielectric waveguide circuit so as to maintain a specified space between the two parallel metal plates. Hence, all other elements, including a non-radiative dielectric waveguide, should be the same height as the spacer. Since the space between the two metal plates is kept constant in the way described above, it is impossible to insert different-sized parts or a different-sized non-radiative dielectric waveguide between the plates. Considering that the size of a non-radiative dielectric waveguide is determined by the wavelength of a frequency, it can be inferred that we are able to propagate only a single frequency because the space between the metal plates is fixed. Therefore, the above approach cannot be applied to most of existing high frequency circuits which use multiple frequencies.

We generally make use of the method of super-heterodyne for most high frequency circuits such as an AM/FM receiver, television set, cellular phone, pager, cordless telephone, walkie-talkie or satellite receiver. The super-heterodyne method is helpful in developing a highly sensitive receiver because it converts a frequency in the middle of signal-processing to enhance amplitude. Also in the case of a transmitter, in order to promote its modulation characteristic, the amplitude of a frequency gets increased by modulating at a low frequency and multiplying it, and those operations finally cause to increase its modulation index. By contrast, a non-radiative dielectric waveguide circuit, which has a fixed gap between two plates cannot make any change in frequency, using only a single frequency. Consequently, it is impossible to construct such ultra-high frequency circuits mentioned above by use of the conventional non-radiative dielectric waveguide circuit.

Furthermore, the data transmission speed is now becoming faster. Accordingly, a using frequency is getting higher, and that requires the size of a non-radiative dielectric waveguide to be smaller. As an example, if a frequency is 60 GHz, the size of a non-radiative dielectric waveguide is 2.25 mm×2.5 mm. If a frequency is 120 GHz, however, the size of a non-radiative dielectric waveguide is 1.125 mm×1.25 mm that is half the size of the non-radiative dielectric waveguide in the case of 60 GHz. For the frequency of 120 GHz, even if the waveguide is invented, semiconductors such as a gunn diode is unable to be inserted into a space of 1.25 mm. This is because a semiconductor with a diameter of 3 mm is usually sold and it is hard to downsize due to inner calorification.

SUMMARY OF THE INVENTION

An object of the invention is to provide a non-radiative dielectric waveguide circuit with multiple layers on each metal plate and with multiple non-radiative dielectric waveguide in different sizes being available to multiple different frequencies.

DETAILED DESCRIPTION OF THE PREFERRED EMBODIMENTS

The most distinctive feature of the present invention is that a singular circuit has different-sized non-radiative dielectric waveguides each of which produces its corresponding frequency. Another feature is that there are different heights of spacers between the metal plates to make each different non-radiative dielectric waveguide fit. By doing so, we are able to deal with more than one frequency in a single circuit.

Studying the embodiments of the present invention will assist much in comprehending the purposes, characteristics and advantages of the invention with reference to the accompanying drawings.

Figure 1:
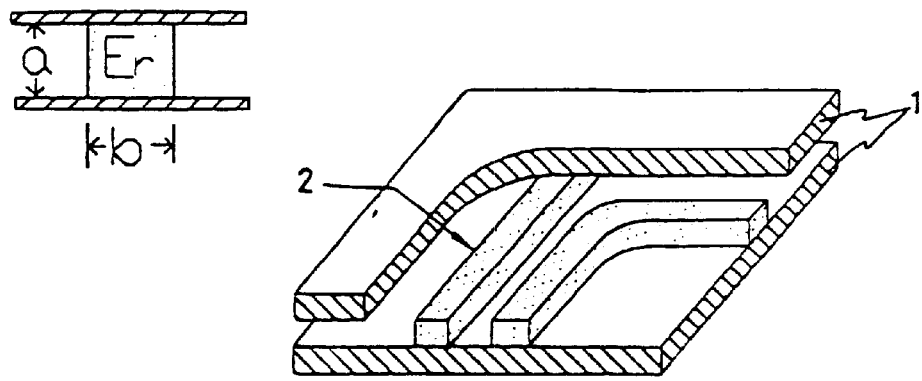
FIG. 1 is a perspective view of a conventional circuit with a non-radiative dielectric waveguide.
Figure 2A:
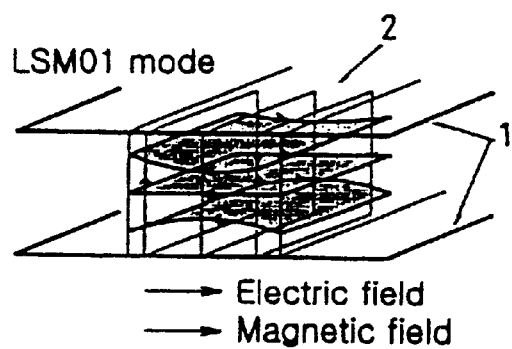
FIG. 2 (a) and (b) are distribution charts showing electric fields and magnetic fields of electromagnetic waves which are propagated in the conventional non-radiative dielectric waveguide in LSM 01 mode and LSE 01 mode.
Figure 2B:
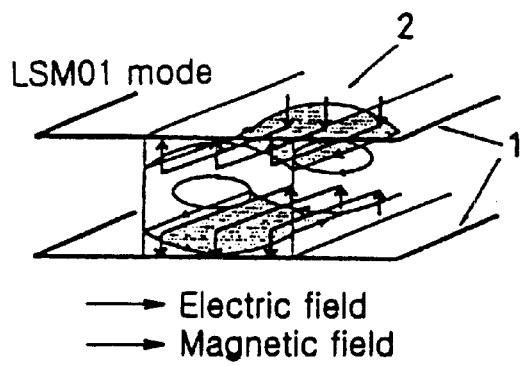
Figure 3:
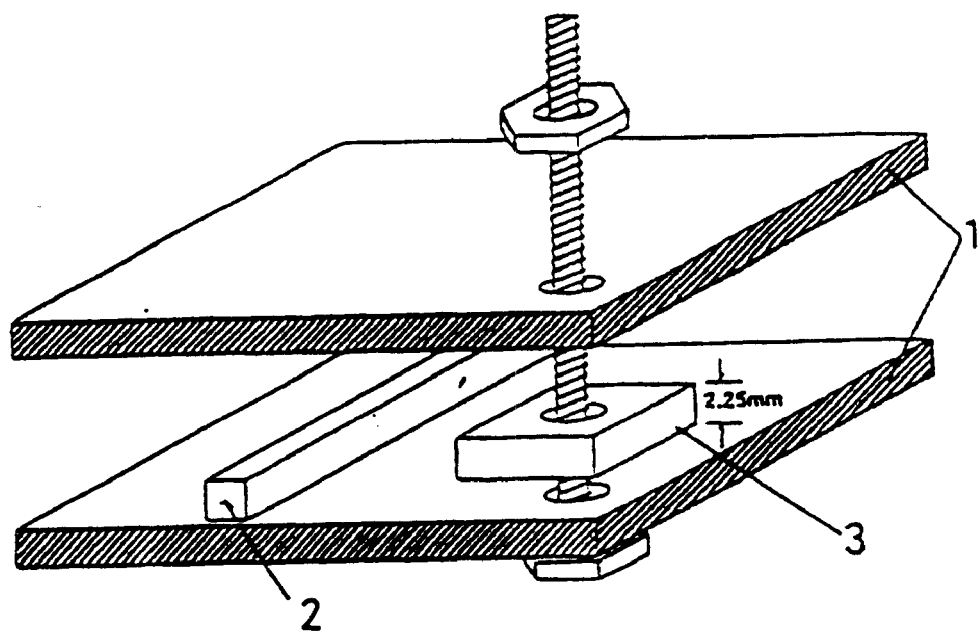
FIG. 3 is a perspective view of the conventional circuit with a non-radiative dielectric waveguide, describing the way to keep a specified space between the parallel plates.
Figure 4:
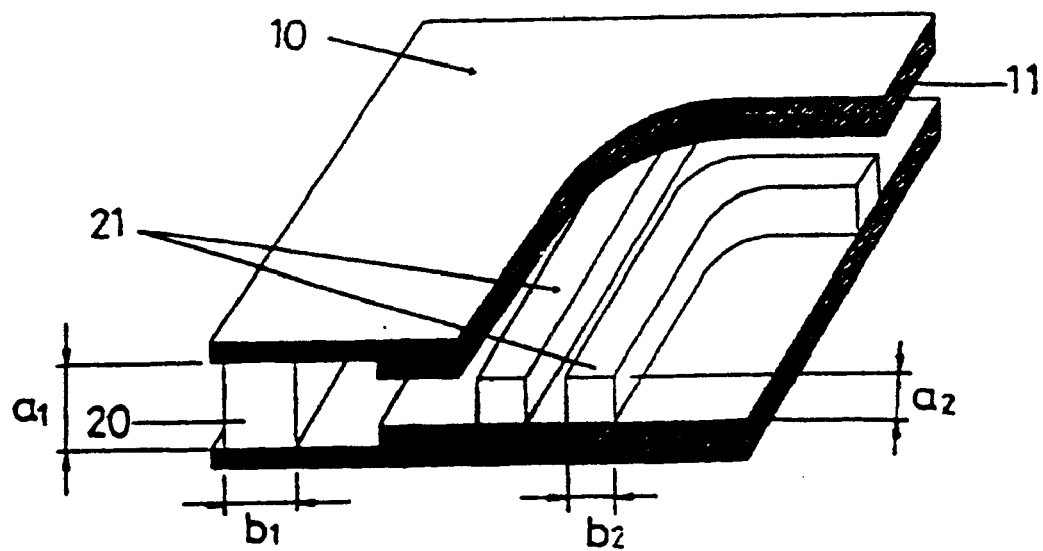
FIG. 4 is a perspective view of a circuit with non-radiative dielectric waveguides which is created on the basis of the present invention.

FIG. 4 presents a non-radiative dielectric waveguide circuit with the features described above. As can be seen in that figure, piling metal plates (10, 11) allows such a variety of spacers (not shown) between them that a variety of different-sized non-radiative dielectric waveguides (20, 21) can be inserted between the metal plates and accordingly, a number of frequencies can be propagated.

The non-radiative dielectric waveguide(20) is the one in which a low frequency is propagated and has the size of a1×b1 which is determined by the low frequency. The right-hand non-radiative dielectric waveguide(21) are the ones in which high frequencies are propagated and have the size of a2×b2 which is determined by the high frequencies according to Eq. 1 and Eq. 2. In this case, either a strip resonator or a metal rod is used for joining the two different non-radiative dielectric waveguides with different frequencies, so signals are transmitted from one waveguide to the other.

Figure 5:
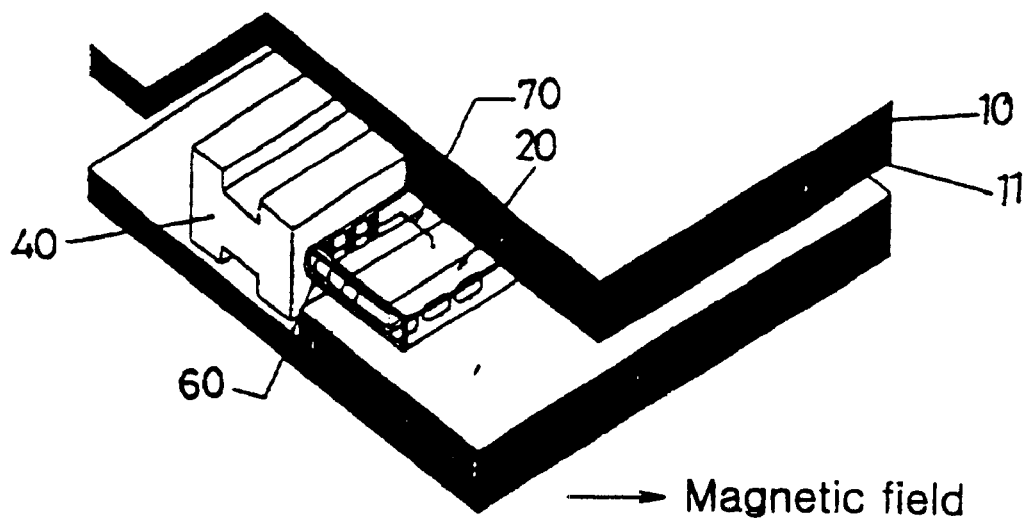
FIG. 5 is a perspective view of a circuit with non-radiative dielectric waveguides with multiple layers on each plate, which is used for oscillation and propagation of millimeter waves, according to a first embodiment of the present invention.

FIG. 5 shows an oscillation and propagation circuit in a multi-layered non-radiative dielectric waveguide circuit which is a first embodiment of the present invention. A diode mount (40) is placed between two metal plates (10) with a wider space. The strip resonator (60) is inserted between the other metal plates (11) inside which there is also a non-radiative dielectric waveguide (20) whose frequency is right for oscillation power from the strip resonator (60). Consequently, the oscillation power from the diode (51) is transmitted to the non-radiative dielectric waveguide (20) through the strip resonator (60).

Figure 6:
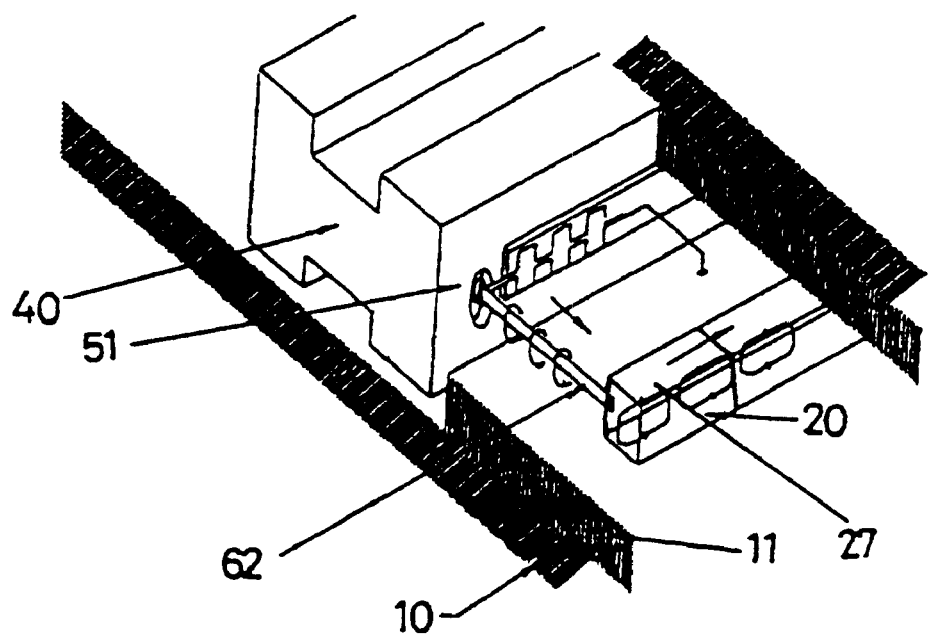
FIG. 6 is a perspective view of a circuit with non-radiative dielectric waveguides with multiple layers on each plate, which is used for propagation of oscillation power according to a second embodiment of the present invention.

FIG. 6 describes a propagation circuit of oscillation power in a multi-layered non-radiative dielectric waveguide circuit which is a second embodiment of the present invention. As an alternative way to the use of the metal strip resonator (60) in FIG. 5, FIG. 6 presents a metal rod (62) for joining the relatively huge diode mount (40) and the small-sized non-radiative dielectric waveguide (20) whose frequency is high. In order to stabilize LSM mode of electromagnetic fields, a mode suppressor (27) is positioned at a connecting point between the metal rod (62) and the non-radiative dielectric waveguide (20).

Figure 7:
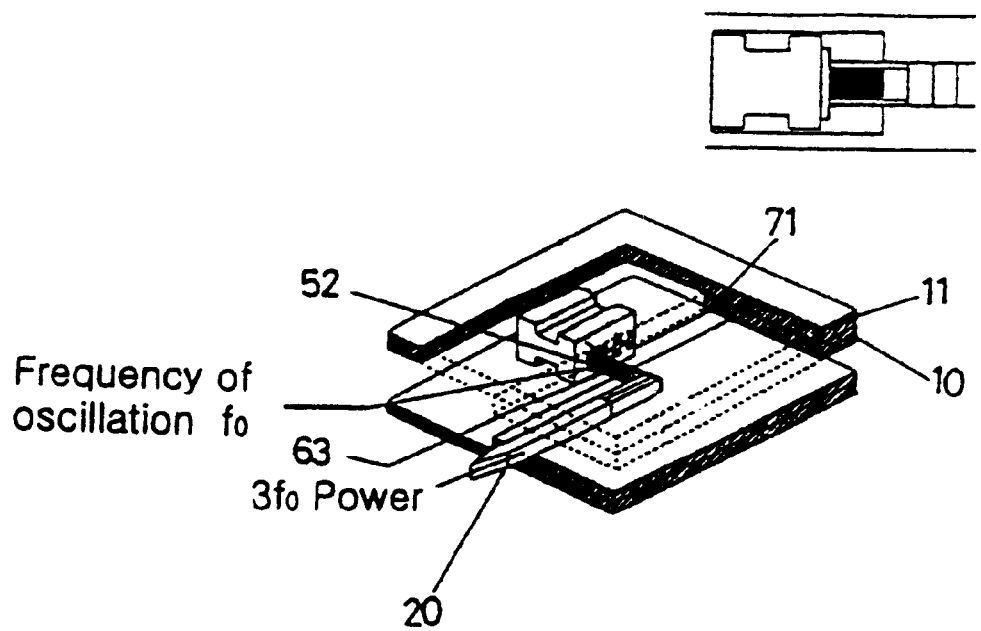
FIG. 7 is a perspective view of a circuit with non-radiative dielectric waveguides with multiple layers on each plate, which is used to produce triple-multiplied oscillation power according to a third embodiment of the present invention.

FIG. 7 illustrates a triple-multiplication circuit of oscillation power in a multi-layered non-radiative dielectric waveguide circuit which is a third embodiment of the present invention. As a using frequency grows higher, the size of an non-radiative dielectric waveguide gets smaller. This fact causes a problem that a gunn diode which can generate more than 100 GHz is hard to obtain. The present invention solves the problem by oscillating a gunn diode at a low frequency and then attaining a high frequency through the multiplication circuit. As an example in FIG. 7, the gunn diode (52) oscillates to produce a frequency of 20 GHz and a strip resonator (63) is set to produce a frequency of 60 GHz, which is a triple-multiplied frequency thereof. Of course, the non-radiative dielectric waveguide (20) in the multi-layered structure has a height of 2.25 mm, which is suitable for 60 GHz. Through those operations above, a circuit which can generate 60 GHz is completed.

Figure 8:
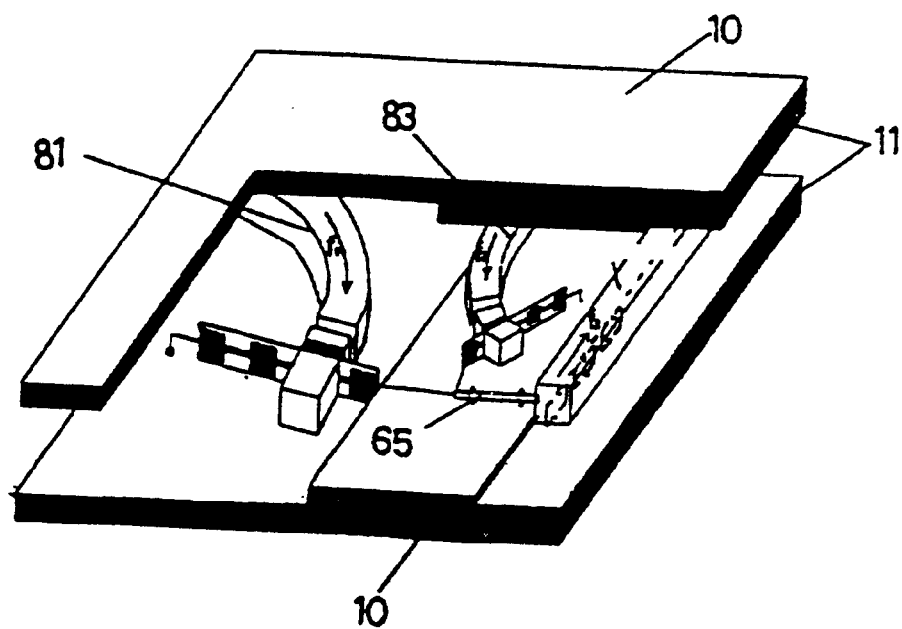
FIG. 8 is a perspective view of a circuit with non-radiative dielectric waveguides with multiple layers on each plate, which is used as a mixer circuit according to a fourth embodiment of the present invention.

FIG. 8 shows a mixer circuit in a multi-layered non-radiative dielectric waveguide circuit which is a fourth embodiment of the present invention. The mixer circuit creates a new frequency by mixing two frequencies. F1 from one non-radiative dielectric waveguide (81) and F2, from the other non-radiative dielectric waveguide (83) are mixed through a diode (not shown). After the mixing, F3 is produced.

$$F3 = | F1 - F2 | \quad 1$$

The new frequency, F3 determines the size of an non-radiative dielectric waveguide in which F3 is propagated, and the non-radiative dielectric waveguide of F3 determines the size of a space between metal plates in which the non-radiative dielectric waveguide is disposed. As depicted above, a new different frequency is produced in a multi-layered non-radiative dielectric waveguide circuit. The use of the multi-layered non-radiative dielectric waveguide circuit makes it possible to construct a super-heterodyne receiver, a multiplication oscillator and an FM transmitter.

The present invention presents a multi-layered non-radiative dielectric waveguide circuit. It is possible to put multiple different-sized non-radiative dielectric waveguides each of which corresponds to its using frequency, in a single circuit with multiple layers. This characteristic of the present invention also offers the advantage of inventing a high frequency circuit.

The embodiments given above are presented for the purpose of providing desirable examples, and any changes and modifications of the invention is possible to those who are related to the art. It is to be understood that such changes and modifications should be within the scope of the invention which is indicated by the appended claims.

What is claimed is:

1. A non-radiative dielectric waveguide circuit positioned between two parallel metal plates comprising, multiple different spaces in height by which multiple different-sized non-radiative dielectric waveguides are positioned between said two parallel metal plates in which multiple different frequencies can be propagated, said circuit further comprising a strip resonator disposed to connect one or more Gunn diode oscillators, by which said multiple different frequencies are fed to the non-radiative dielectric waveguide circuit.

2. A non-radiative dielectric waveguide circuit according to claim 1, further comprising a metal rod disposed to connect one or more Gunn diode oscillators, by which said multiple different frequencies are fed to the non-radiative dielectric waveguide circuit.

3. A non-radiative dielectric waveguide circuit according to claim 1, which acts as a frequency-multiplication oscillator by positioning said Gunn diode oscillators between metal plates for a low frequency, by positioning the non-radiative dielectric waveguide between metal plates for high frequency and by connecting said Gunn diode oscillator and said non-radiative dielectric waveguide with said strip resonator.

4. A non-radiative dielectric circuit according to claim 1, which is used as a mixer circuit by linking two different frequency circuits with said strip resonator.

5. A non-radiative dielectric waveguide circuit according to claim 2, which acts as a frequency multiplication oscillator, by positioning said Gunn diode oscillators between metal plates for a low frequency, by positioning the non-radiative dielectric waveguide between metal plates for high frequency and by connecting said Gunn diode oscillator and said non-radiative dielectric waveguide with said metal rod.

6. A non-radiative dielectric waveguide circuit according to claim 2, which is. used as a mixer circuit by linking two different frequency circuits with said metal rod.

* * * * *